United States Patent
Chou et al.

(10) Patent No.: US 7,957,141 B2
(45) Date of Patent: Jun. 7, 2011

(54) HEAT-DISSIPATING MECHANISM FOR USE WITH MEMORY MODULE

(75) Inventors: Chia-Hsing Chou, Taipei (TW); Chih-Wei Tsai, Taipei (TW); Chia-Hung Lu, Taipei (TW)

(73) Assignee: Asustek Computer Inc., Taipei (TW)

( * ) Notice: Subject to any disclaimer, the term of this patent is extended or adjusted under 35 U.S.C. 154(b) by 0 days.

(21) Appl. No.: 12/851,754

(22) Filed: Aug. 6, 2010

(65) Prior Publication Data

US 2010/0302732 A1 Dec. 2, 2010

Related U.S. Application Data

(63) Continuation of application No. 12/468,636, filed on May 19, 2009, now Pat. No. 7,791,881.

(30) Foreign Application Priority Data

Jun. 11, 2008 (TW) ................................ 97121750 A

(51) Int. Cl.
*H05K 7/20* (2006.01)
(52) U.S. Cl. ....... 361/695; 361/719; 361/721; 165/80.3; 165/122
(58) Field of Classification Search .................... None
See application file for complete search history.

(56) References Cited

U.S. PATENT DOCUMENTS

| 6,130,820 | A | 10/2000 | Konstad et al. | |
| 6,249,428 | B1 | 6/2001 | Jeffries et al. | |
| 6,269,001 | B1 | 7/2001 | Matteson et al. | |
| 6,775,139 | B2 | 8/2004 | Hsueh | |
| 7,050,303 | B2 * | 5/2006 | Park et al. | 361/715 |
| 7,221,569 | B2 | 5/2007 | Tsai | |
| 7,286,355 | B2 | 10/2007 | Cheon | |
| 7,447,024 | B1 | 11/2008 | Chou | |
| 7,480,147 | B2 | 1/2009 | Hoss et al. | |
| 2008/0123294 | A1 * | 5/2008 | Tsai | 361/695 |
| 2009/0219687 | A1 | 9/2009 | Lin | |
| 2010/0188817 | A1 * | 7/2010 | Chou et al. | 361/697 |

FOREIGN PATENT DOCUMENTS

| CN | 2826508 Y | 10/2006 |
| CN | 2870172 Y | 2/2007 |

* cited by examiner

*Primary Examiner* — Boris L Chervinsky
(74) *Attorney, Agent, or Firm* — Kirton & McConkie; Evan R. Witt

(57) ABSTRACT

A heat-dissipating mechanism includes a first heat-dissipating device, a first positioning device, a second heat-dissipating device and a second positioning device. The first heat-dissipating device is contacted with a memory module. The first positioning device is disposed on the first heat-dissipating device and includes a protrusion. The second heat-dissipating device is connected with the first heat-dissipating device. The second positioning device has a positioning rail formed in the second heat-dissipating device and corresponding to the protrusion. The second heat-dissipating device is connected with the first heat-dissipating device when the protrusion of the first positioning device is embedded into the positioning rail second positioning device.

10 Claims, 5 Drawing Sheets

HEAT-DISSIPATING MECHANISM FOR USE WITH MEMORY MODULE

FIELD OF THE INVENTION

The present invention relates to a heat-dissipating mechanism, and more particularly to a heat-dissipating mechanism for use with a memory module.

BACKGROUND OF THE INVENTION

A random access memory (RAM) is a data storage medium of a computer system for temporarily storing data. The random access memory is writable or readable at any time and at a very fast write/read speed. Generally, during the operating system or other application programs are running, the random access memory (RAM) is used as a temporary data storage medium.

Recently, since the functions of the computer system become more and more powerful, the accessing speed of the random access memory (RAM) is gradually increased. As such, a great deal of heat is generated during operation of the random access memory (RAM). If no proper heat-dissipating mechanism is provided to transfer enough heat to the surrounding, the elevated operating temperature may result in a damage of the random access memory (RAM), a breakdown of the whole computer system or a reduced operating efficiency. For most RAM manufacturers, it is important to dissipate the heat generated by the random access memory (RAM) in order to enhance the operating stability.

As known, a series of random access memories are packaged into a memory module. For dissipating the heat generated by the random access memories, a common method attaches a heat-dissipating device onto the surface of the memory module of the random access memories. FIG. 1A is a schematic exploded view illustrating a memory module and a heat-dissipating device according to the prior art. As shown in FIG. 1A, the heat-dissipating device includes two metallic plates 10. The metallic plates 10 are made of high thermally-conductive material such as aluminum. In addition, the inner surface of the metallic plate 10 is usually coated with a thermal pad 101 (or a thermal adhesive). Via the thermal pads 101, two metallic plates 10 are attached onto bilateral sides of the memory module 11 and thus the memory module 11 is enclosed by these two metallic plates 10. Since the thermal pads 101 at the inner surfaces of the metallic plates 10 are in direct contact with the memory module 11, the heat-dissipating efficacy is enhanced. After the memory module 11 is sandwiched by these two metallic plates 10, the sandwiched structure is fixed by one or more clamps 12 so as to produce the combination of the memory module 11 and the metallic plates 10. The resulting structure of the combination of the memory module 11 and the metallic plates 10 is shown in FIG. 1B.

Moreover, a fan may be used for further removing the heat generated by the memory module. FIG. 1C is a schematic perspective view illustrating a heat-dissipating mechanism including the heat-dissipating device of FIG. 1B and a fan. In addition to the metallic plates 10 of the heat-dissipating device, the heat-dissipating mechanism 1000 of FIG. 1C further comprises a fan 13. Generally, the fan 13 is mounted on a supporting frame 14. The supporting frame 14 is disposed beside the memory module 11. Since the supporting frame 14 is separated from the metallic plate 10 by a gap, the heat-dissipating efficacy is unsatisfied. Moreover, since the supporting frame 14 occupies much space of the motherboard 1001 of the computer system, the space utilization of the motherboard 1001 is reduced.

SUMMARY OF THE INVENTION

The present invention provides a heat-dissipating mechanism for use with a memory module in order to efficiently remove the heat generated from the memory module and increase the space utilization of the motherboard.

In an embodiment, the heat-dissipating mechanism includes a first heat-dissipating device, a first positioning device, a second heat-dissipating device and a second positioning device. The first heat-dissipating device is contacted with the memory module. The first positioning device is disposed on the first heat-dissipating device and includes a protrusion. The second heat-dissipating device is connected with the first heat-dissipating device. The second positioning device has a positioning rail formed in the second heat-dissipating device and corresponding to the protrusion. The second heat-dissipating device is connected with the first heat-dissipating device when the protrusion of the first positioning device is embedded into the positioning rail second positioning device.

BRIEF DESCRIPTION OF THE DRAWINGS

The above contents of the present invention will become more readily apparent to those ordinarily skilled in the art after reviewing the following detailed description and accompanying drawings, in which.

DETAILED DESCRIPTION OF THE PREFERRED EMBODIMENT

The present invention will now be described more specifically with reference to the following embodiments. It is to be noted that the following descriptions of first preferred embodiments of this invention are presented herein for purpose of illustration and description only. It is not intended to be exhaustive or to be limited to the precise form disclosed.

Figure 1A:
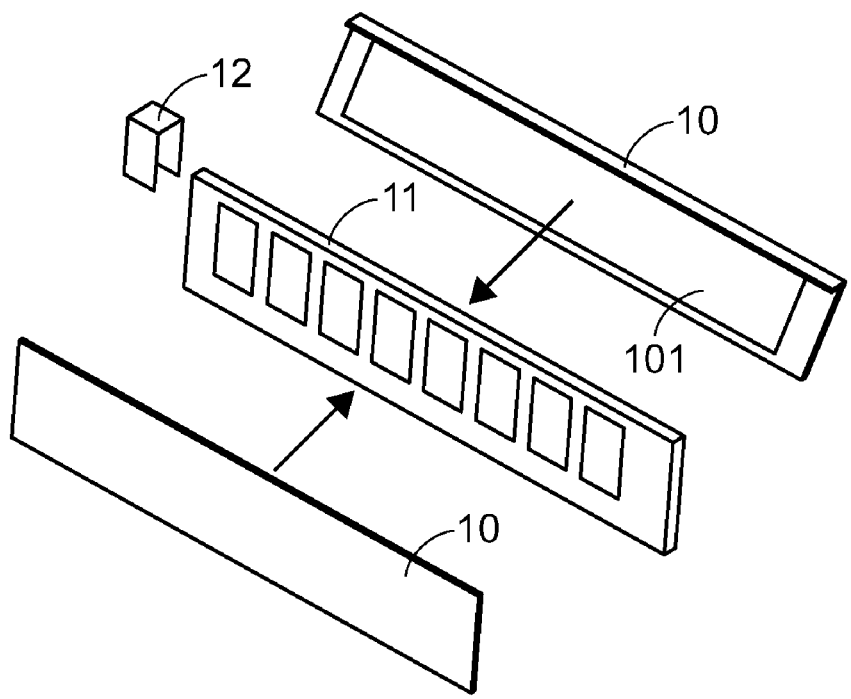
FIG. 1A is a schematic exploded view illustrating a memory module and a heat sink according to the prior art.
Figure 1B:
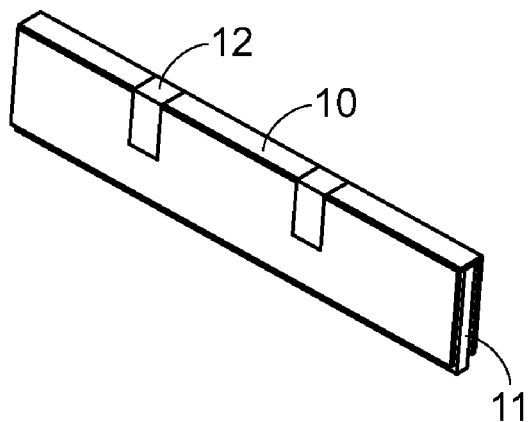
FIG. 1B is a schematic assembled view illustrating the combination of the memory module and the heat-dissipating device shown in FIG. 1A.
Figure 1C:
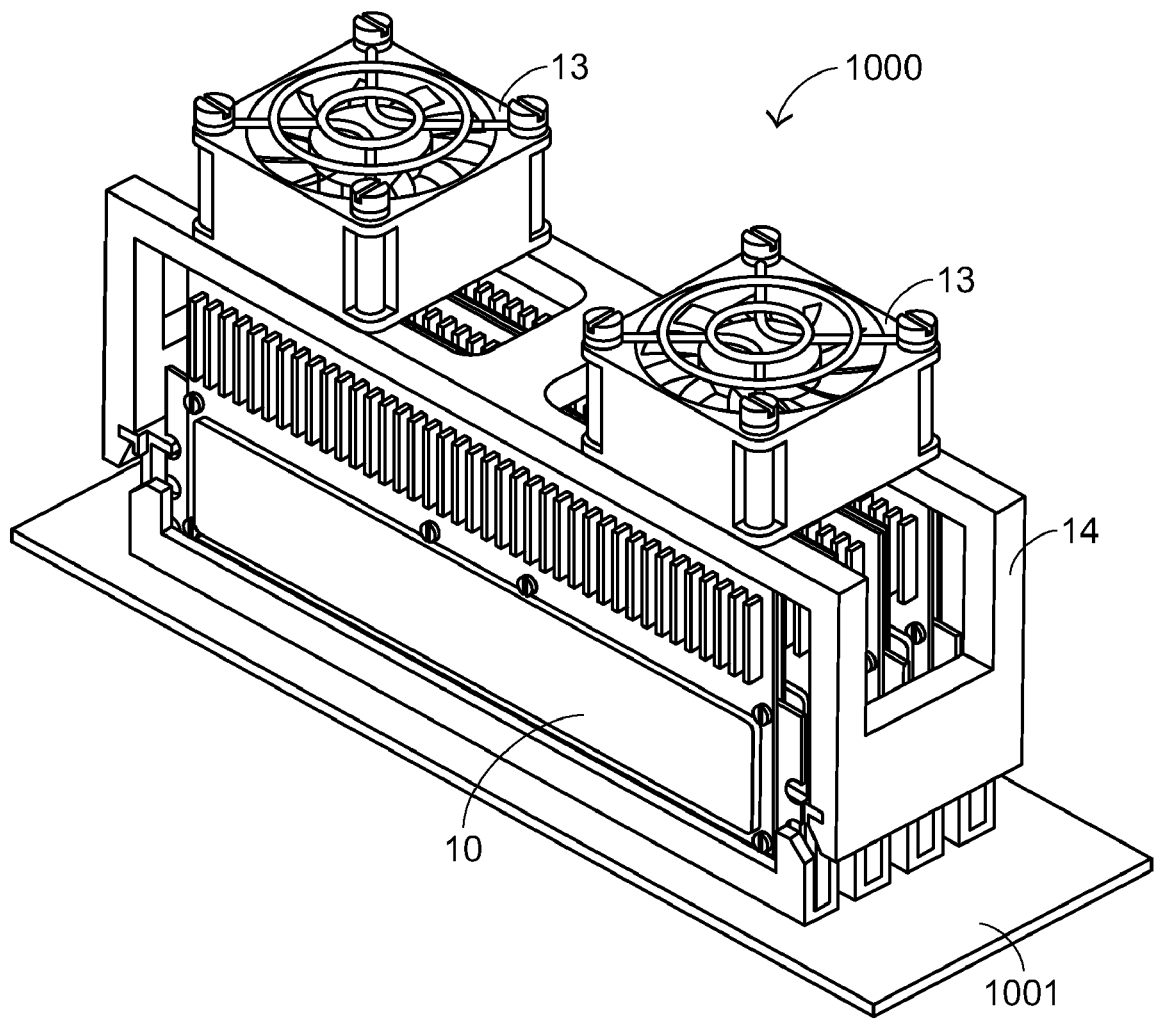
FIG. 1C is a schematic perspective view illustrating a heat-dissipating mechanism including the heat-dissipating device of FIG. 1B and a fan.
Figure 2A:
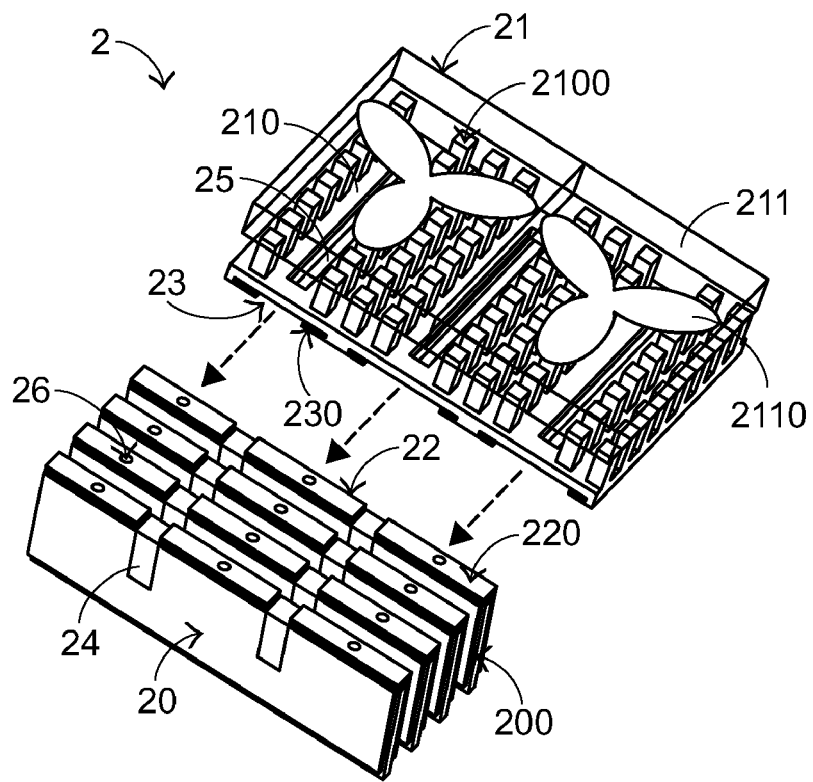
FIG. 2A is a schematic exploded view illustrating a heat-dissipating mechanism for use with a memory module according to a first preferred embodiment of the present invention.

FIG. 2A is a schematic exploded view illustrating a heat-dissipating mechanism for use with a memory module according to a first preferred embodiment of the present invention. The heat-dissipating mechanism 2 is used for dissipating the heat generated by one or more memory modules 200. For clarification, four memory modules 200 are shown in this embodiment. The heat-dissipating mechanism 2 comprises several first heat-dissipating devices 20, a second heat-dissipating device 21, several first positioning devices 22 and a second positioning device 23. The first heat-dissipating devices 20 are connected with the second heat-dissipating device 21. The first positioning devices 22 are integrally formed on respective first heat-dissipating devices 20. Each first positioning device 22 includes one or more protrusions 220. As shown in FIG. 2A, the first positioning device 22 includes three protrusions 220. The second positioning device 23 is formed on the second heat-dissipating device 21 and includes one or more positioning rails 230. In this embodiment, the second positioning device 23 includes three positioning rails 230. In accordance with a key feature of the present invention, after the protrusions 220 of the first positioning device 22 are glided and embedded into corresponding positioning rails 230 of the second positioning device 23, the second heat-dissipating device 21 is fixed onto and contacted with the first heat-dissipating device 20. Since the first heat-dissipating device 20 and the second heat-dissipating device 21 are contacted with each other, the heat-dissipating efficacy is enhanced. In addition, since the first heat-dissipating device 20 and the second heat-dissipating device 21 are connected with each other by means of the protrusions 220 and the positioning rails 230, the space utilization is enhanced in order to obviate the drawbacks encountered from the prior art.

Figure 2B:
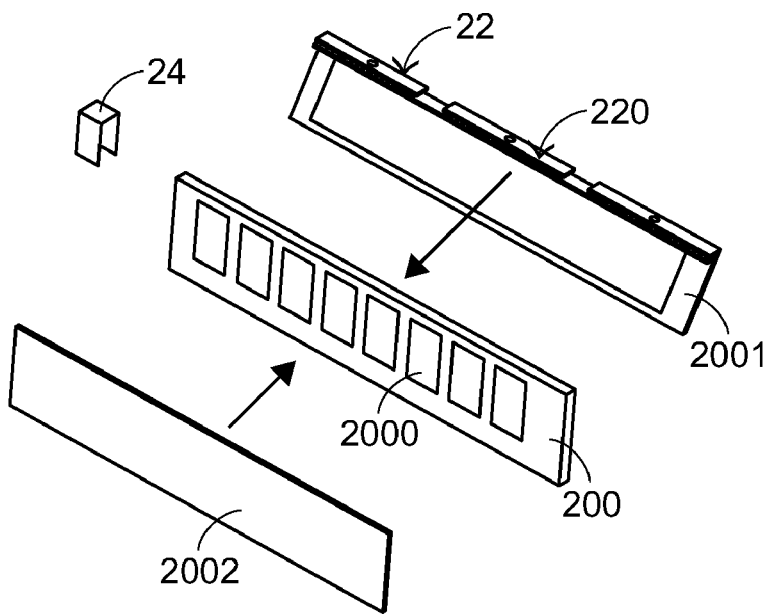
FIG. 2B is a schematic exploded view illustrating the connection between a memory module and a first heat-dissipating device of the heat-dissipating mechanism according to the first preferred embodiment of the present invention.

FIG. 2B is a schematic exploded view illustrating the connection between a memory module and a first heat-dissipating device of the heat-dissipating mechanism according to the first preferred embodiment of the present invention. The memory module 200 has multiple chips 2000 such as RAM chips. During operation of the chips 2000, a great deal of heat is generated. The first heat-dissipating device 20 comprises a first metallic plate 2001 and a second metallic plate 2002, which are made of high thermally-conductive material. The protrusions 220 of the first positioning device 22 are integrally formed with the first metallic plate 2001. After the first metallic plate 2001 and the second metallic plate 2002 are combined together, a receptacle is defined between the first metallic plate 2001 and the second metallic plate 2002 for accommodating the memory module 200. After the memory module 200 is accommodated within the receptacle between the first metallic plate 2001 and the second metallic plate 2002, the chips 2000 are directly contacted with the first metallic plate 2001 and the second metallic plate 2002. As such, the heat generated by the memory module 200 will be conducted away by means of the first metallic plate 2001 and the second metallic plate 2002. In some embodiments, the outer surfaces of the first metallic plate 2001 and the second metallic plate 2002 are clamped by one or more clamps 24 in order to fix the first metallic plate 2001 and the second metallic plate 2002.

Figure 2C:
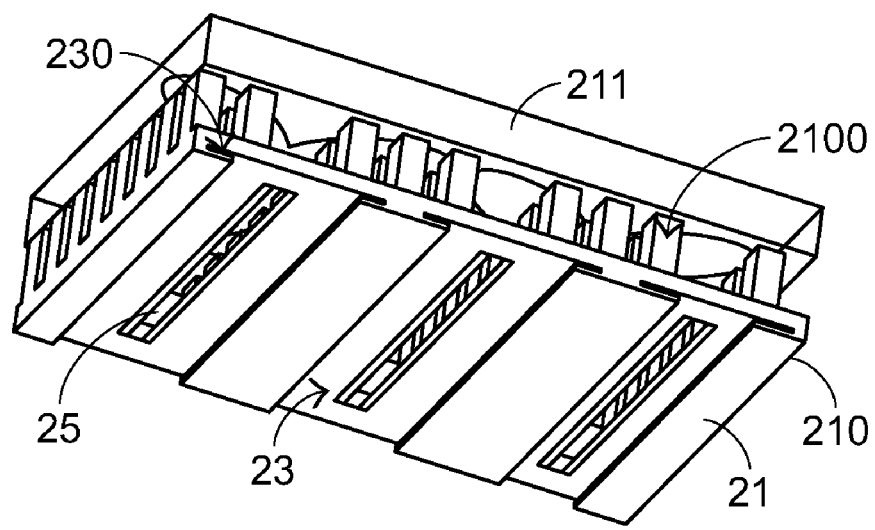
FIG. 2C is a schematic assembled view illustrating the second heat-dissipating device of the heat-dissipating mechanism as shown in FIG. 2A.

FIG. 2C is a schematic assembled view illustrating the second heat-dissipating device of the heat-dissipating mechanism as shown in FIG. 2A. As shown in FIG. 2C, the second heat-dissipating device 21 comprises a heat sink 210 and a fan module 211. The fan module 211 includes one or more fans 2110. In this embodiment, the fan module 211 includes two fans 2110. The heat sink 210 is substantially a metallic plate. After the protrusions 220 of the first positioning device 22 are movably embedded into corresponding positioning rails 230 of the second positioning device 23, the bottom surface of the heat sink 210 is contacted with the first positioning device 22. For increasing the heat transfer area, multiple post-like fins 2100 are formed on the top surface of the heat sink 210. Moreover, the fans 2110 are fixed on the fins 2100. The use of the fan module 211 can facilitate removing heat to the ambient air. As a consequence, the heat generated by the memory modules 200 will be conducted to the heat sink 210 and then radiated to the ambient air by forced convection because the fan module 211 can either inhale the ambient air to cool the heat sink 210 or exhaust the hot air to the ambient air.

Figure 2D:
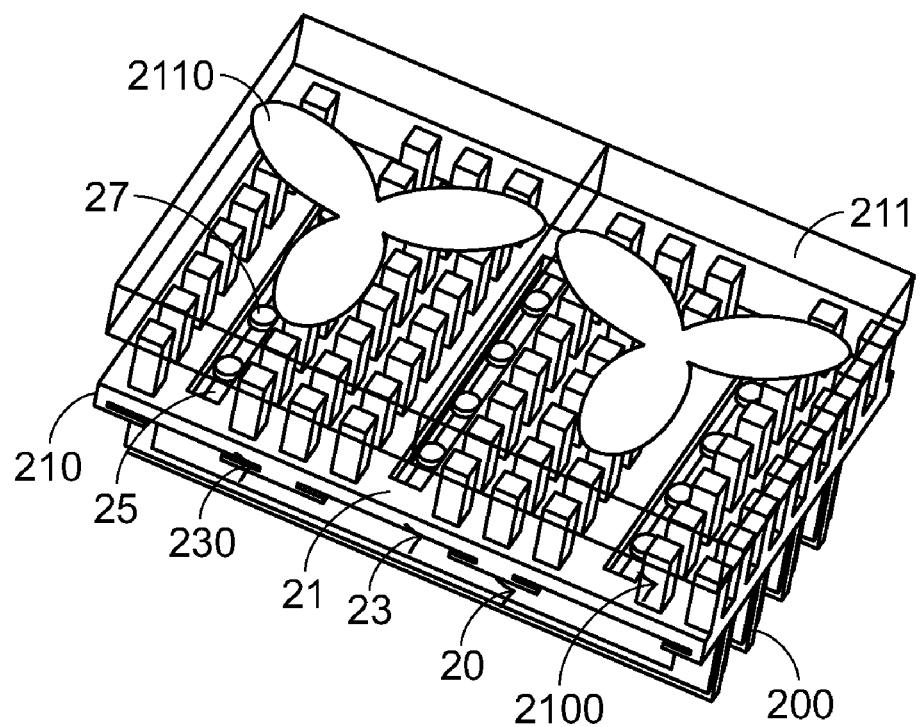
FIG. 2D is a schematic assembled view illustrating the second heat-dissipating device of the heat-dissipating mechanism that is taken from a different viewpoint.

FIG. 2D is a schematic assembled view illustrating the second heat-dissipating device of the heat-dissipating mechanism that is taken from a different viewpoint. Please refer to FIG. 2A and FIG. 2D. The heat-dissipating mechanism 2 further comprises one or more fastening grooves 25 and one or more fastening holes 26. The fastening grooves 25 are formed in the heat sink 210 of the second heat-dissipating device 21. The fastening holes 26 are formed on some or all of the protrusions 220 of the first positioning device 22. The fastening holes 26 are aligned with corresponding fastening grooves 25. After the protrusions 220 of the first positioning device 22 are movably embedded into corresponding positioning rails 230 of the second positioning device 23, screws 27 can be penetrated through the fastening grooves 25 and screwed in corresponding fastening holes 26 so as to fix the second heat-dissipating device 21 onto the second heat-dissipating device 21. The resulting structure of the combination of the first heat-dissipating device 20 and the second heat-dissipating device 21 is shown in FIG. 2D.

In the above embodiment, the first heat-dissipating device 20 and the second heat-dissipating device 21 are connected with each other when the protrusions 220 of the first positioning device 22 are embedded into corresponding positioning rails 230 of the second positioning device 23. Since the first heat-dissipating device 20 and the second heat-dissipating device 21 are closely contacted with each other, the heat-dissipating efficacy of the heat-dissipating mechanism is enhanced. Moreover, since the first heat-dissipating device 20 and the second heat-dissipating device 21 are closely contacted with each other, the space utilization of the motherboard is increased.

Figure 3A:
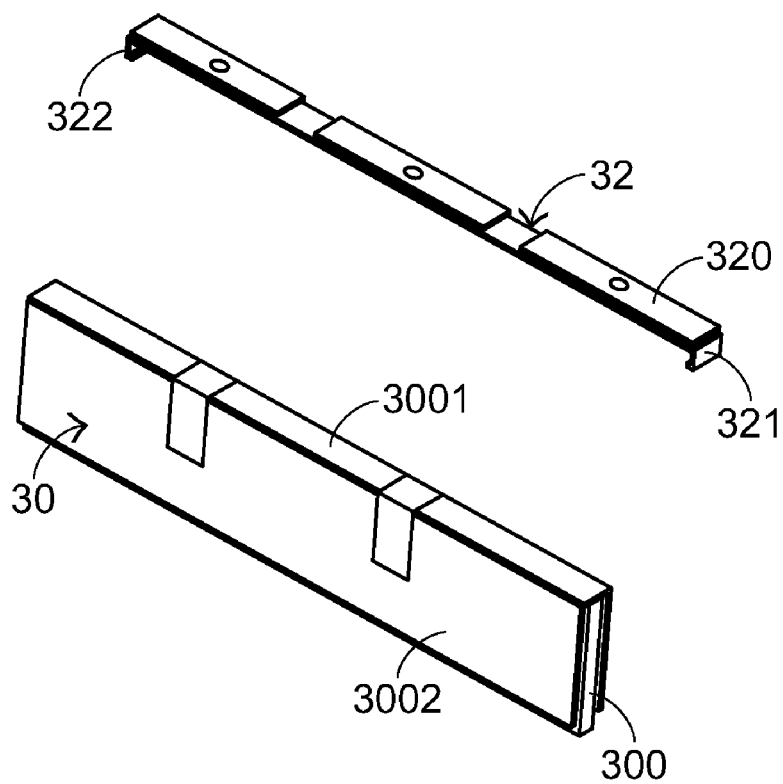
FIG. 3A and FIG. 3B are respectively schematic exploded and assembled views illustrating the relation between the first heat-dissipating device, the memory module and the first positioning device according to a second preferred embodiment of the present invention.
Figure 3B:
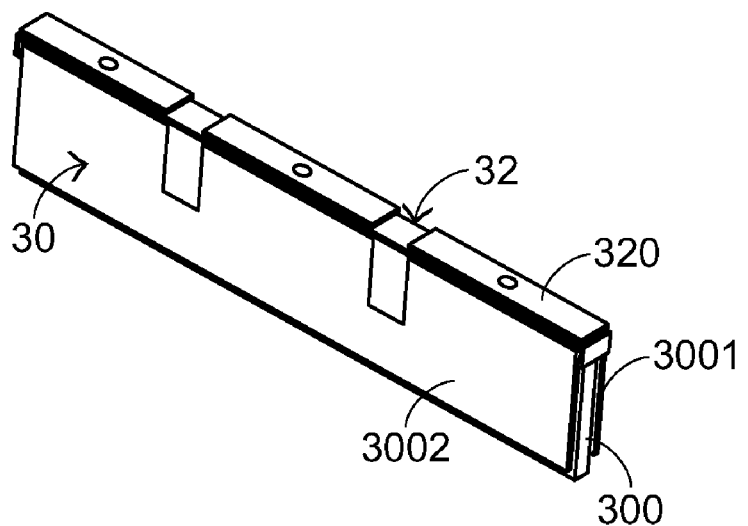

It is noted that, however, those skilled in the art will readily observe that numerous modifications and alterations may be made while retaining the teachings of the invention. FIG. 3A and FIG. 3B are respectively schematic exploded and assembled views illustrating the relation between the first heat-dissipating device, the memory module and the first positioning device according to a second preferred embodiment of the present invention. As shown in FIG. 3A, the first heat-dissipating device 30 also comprises a first metallic plate 3001 and a second metallic plate 3002, which are made of high thermally-conductive material. After the first metallic plate 3001 and the second metallic plate 3002 are combined together, a receptacle is defined between the first metallic plate 3001 and the second metallic plate 3002 for accommodating the memory module 300.

As previously described in the first preferred embodiment, the first positioning device 22 is integrally formed on the first metallic plate 2001 of the first heat-dissipating device 20 (as shown in FIG. 2A and FIG. 2B). In contrast, the first positioning device 32 of this embodiment is a prop stand 32 having one or more protrusions 320 and two tenons 321 and 322. The tenons 321 and 322 are respectively disposed on both ends of the prop stand 32. After the memory module 300 is sandwiched between the first metallic plate 3001 and the second metallic plate 3002, the tenons 321 and 322 may be fastened on both ends of the first heat-dissipating device 30 such that the first positioning device 32 is fixed on the first heat-dissipating device 30. The resulting structure of the combination of the first positioning device 32 and the first heat-dissipating device 30 is shown in FIG. 3B. Similarly, after the protrusions 320 of the first positioning device 32 are glided and embedded into corresponding positioning rail of the second positioning device 23 (as shown in FIG. 2), the second heat-dissipating device 21 is connected to and contacted with the first heat-dissipating device 30. The configurations of the second heat-dissipating device 21 and the second positioning device 23 are identical to those shown in FIG. 2, and are not redundantly described herein.

While the invention has been described in terms of what is presently considered to be the most practical and first preferred embodiments, it is to be understood that the invention needs not to be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A heat-dissipating mechanism for use with a memory module, the heat-dissipating mechanism comprising:
    a memory module having a plurality of chips on a printed circuit board;
    a first heat-dissipating device contacted with the chips on the memory module;
    a first positioning device disposed on the first heat-dissipating device, the first positioning device being a prop stand having a protrusion and being detachably connected with the first heat-dissipating device;
    a heat sink, having a first surface and a second surface, the first surface being fastened to the first heat-dissipating device; and
    a fan module mounted on the second surface of the heat sink, the fan module being configured for producing an air flowing;
    wherein the first heat-dissipating device and the heat sink transfer the heat generated by the memory module to the external environment.

2. The heat-dissipating mechanism according to claim 1 wherein the first heat-dissipating device includes a first metallic plate and a second metallic plate, which are combined together to define a receptacle for accommodating the memory module.

3. The heat-dissipating mechanism according to claim 2 further comprising a clamp for clamping outer surfaces of the first metallic plate and the second metallic plate after the memory module is sandwiched between the first metallic plate and the second metallic plate, thereby fixing the first metallic plate and the second metallic plate.

4. The heat-dissipating mechanism according to claim 1 wherein the
    first surface is connected with the first heat-dissipating device, a plurality of post-like fins are formed on the second surface of the heat sink,
    and the fan module is connected with the fins of the heat sink and comprises a fan for inhaling ambient air to cool the heat sink or exhausting the hot air within the heat sink to the ambient air.

5. The heat-dissipating mechanism according to claim 1 wherein the prop stand further includes two tenons respectively disposed on both ends of the prop stand, and the prop stand is fixed on the first heat-dissipating device via the tenons.

6. A heat-dissipating mechanism for use with a memory module, the heat-dissipating mechanism comprising:
    a memory module;
    a first heat-dissipating device comprising a first metallic plate and a second metallic plate, which are combined together to define a receptacle for accommodating the memory module;
    a first positioning device integrally formed on the first heat-dissipating device, the first positioning device being a prop stand having a protrusion and being connected with the first heat-dissipating device;
    a heat sink, contacted with the first heat-dissipating device; and
    a fan module located at the heat sink, the fan module being configured for producing an air flowing;
    wherein the first heat-dissipating device and the heat sink transfer the heat generated by the memory module to the external environment.

7. The heat-dissipating mechanism according to claim 6 further comprising a clamp for clamping outer surfaces of the first metallic plate and the second metallic plate after the memory module is sandwiched between the first metallic plate and the second metallic plate, thereby fixing the first metallic plate and the second metallic plate.

8. The heat-dissipating mechanism according to claim 6 wherein the
    heat sink has a first surface connected with the first heat-dissipating device, a plurality of post-like fins are formed on a second surface of the heat sink,
    and the fan module is connected with the fins of the heat sink and comprises a fan for inhaling ambient air to cool the heat sink or exhausting the hot air within the heat sink to the ambient air.

9. The heat-dissipating mechanism according to claim 6 wherein the prop stand further includes two tenons respectively disposed on both ends of the prop stand, and the prop stand is fixed on the first heat-dissipating device via the tenons.

10. A heat-dissipating mechanism for use with a memory module, the heat-dissipating mechanism comprising:
    a memory module having a plurality of chips on a printed circuit board;
    a first heat-dissipating device, the first heat-dissipating device defining a receptacle for accommodating the memory module, an inner side of the first heat-dissipating device being directly contacted with the chips on the memory module;
    a first positioning device disposed on the first heat-dissipating device, the first positioning device being a prop stand having a protrusion and being detachably connected with the first heat-dissipating device;
    a heat sink, having a first surface and a second surface, the first surface being fastened to the first heat-dissipating device; and
    a fan module connected with the heat sink, the fan module being configured for producing an air flowing;
    wherein the first heat-dissipating device and the heat sink transfer the heat generated by the memory module to the external environment.

* * * * *